United States Patent [19]
Souza et al.

[11] Patent Number: 6,144,205
[45] Date of Patent: Nov. 7, 2000

[54] OPTICAL CONTROL OF RADIO FREQUENCY ANTENNAE IN A MAGNETIC RESONANCE IMAGING SYSTEM

[75] Inventors: Steven Peter Souza, Williamstown, Mass.; Ronald Dean Watkins, Niskayuna, N.Y.

[73] Assignee: General Electric Company, Schenectady, N.Y.

[21] Appl. No.: 09/195,657

[22] Filed: Nov. 19, 1998

[51] Int. Cl.$^7$ ........................................... G01V 3/00
[52] U.S. Cl. ........................................... 324/322
[58] Field of Search ............... 324/322, 318, 324/307, 309, 312, 306, 300

[56] References Cited

U.S. PATENT DOCUMENTS

| | | | |
|---|---|---|---|
| 5,545,999 | 8/1996 | Mueller et al. | 324/322 |
| 5,869,966 | 2/1999 | Gatehouse | 324/322 |

*Primary Examiner*—Louis Arana
*Attorney, Agent, or Firm*—Jean K. Testa; Donald S. Ingraham

[57] ABSTRACT

A local RF antenna assembly for a magnetic resonance imaging (MRI) system includes a conducting RF antenna structure. First and second capacitors are connected in series with the inductance of the RF antenna structure to form a circuit that resonates at a Larmor frequency. An inductor has a first terminal connected to a node between the first and second capacitors and has a second terminal. A photosensitive first semiconductor switch is connected between the second terminal of the inductor and one terminal of the RF antenna inductance. A receive coil control selectively provides illumination that places the photosensitive first semiconductor switch in a conductive state. When the photosensitive first semiconductor switch is conductive, the inductor disables resonance of the RF antenna circuit at the Larmor frequency. This action inhibits the RF receive antenna from interacting with other antennae in the MRI system.

22 Claims, 3 Drawing Sheets

OPTICAL CONTROL OF RADIO FREQUENCY ANTENNAE IN A MAGNETIC RESONANCE IMAGING SYSTEM

FIELD OF THE INVENTION

The field of the invention is magnetic resonance imaging (MRI) systems; and more particularly, radio frequency antenna assemblies utilized in such systems.

BACKGROUND OF THE INVENTION

When a sample of a substance such as human tissue is subjected to a uniform magnetic field (polarizing field $B_0$, defining the Z axis of a Cartesian coordinate system), the individual magnetic moments of the spins in tissue nuclei attempt to align with this polarizing field, but precess about it in random order at the characteristic Larmor frequency of the nuclei. If the substance is subjected to a magnetic field (excitation field $B_1$) which is in the X-Y plane of the Cartesian coordinate system and which oscillates near the Larmor frequency, the net magnetic moment of the sample aligned along the Z axis, $M_z$, may be rotated, or "tipped", into the X-Y plane to produce a net transverse magnetic moment $M_t$. A magnetic resonance signal is emitted by the excited sample after the excitation signal $B_1$ is terminated. This signal may be modified by application of additional magnetic fields and may be received and processed to form an image. This process known as magnetic resonance imaging (MRI) may be used for medical diagnosis as well as non-medical purposes.

When utilizing these magnetic resonance signals to produce images, magnetic field gradients ($G_x$, $G_y$ and $G_z$) are employed. Typically, the region to be imaged is subjected to a sequence of measurement cycles in which these gradients vary according to the particular localization method being used. The polarizing field $B_0$ and the magnetic field gradients ($G_x$, $G_y$, and $G_z$) typically are produced by relatively large electromagnetic coils around the patient being imaged. The $B_1$ field may be transmitted into the object to be imaged by an antenna, which may be large or small compared with the object, and may or may not also be used to receive the subsequent magnetic resonance signal. Much smaller receive-only antennae, known as "local coils" or "surface coils", commonly are placed in close proximity to the portion of the patient to be imaged in order to better receive the magnetic resonance signals. The resulting set of received signals are digitized and processed to create the image using one of many well-known reconstruction techniques.

Both the transmit and receive antennae are normally resonant at the frequency which is determined by the nuclear species and the static magnetic field strength, to maximize their efficiency. Unfortunately, these antennae can interact with each other via inductive and/or capacitive coupling, changing each other's effective resonant frequency and distorting each other's radio frequency field spatial distribution. This is ordinarily prevented by disabling the receive antenna during the transmit phase of the imaging process, and disabling the transmit antenna resonance during the receive phase.

FIG. 1 shows a technique for enabling and disabling an MRI antenna with series RF switching using a PIN diode activated by DC current pulses. The antenna circuit consists of inductance 10 in series with capacitances 13 and 14 and PIN diode 15, creating a series resonance which has a peak response at the resonant frequency, selected to be the Larmor frequency of the sample nuclei. Capacitance 13 may be a discrete capacitor, a plurality of discrete capacitors in series, or a distributed capacitance. Inductance 10 normally is not a discrete inductor but the distributed inductance of a conducting structure, such as a loop of wire, which receives the magnetic resonance signal. Capacitance 14 is normally a discrete capacitor chosen to provide an impedance match between the antenna circuit and the transmission line, consisting of conductors 11 and 12, which carries the RF signal to the system's receiver. As illustrated the antenna circuit is completed when a DC current 17 is sent through the PIN diode 15, causing PIN diode 15 to conduct at RF frequencies. PIN diodes are utilized because of their high on/off conductance ratio. The circuit is open (disabled) when DC current is not applied to the PIN diode 15. This approach is less than optimum due to significant RF signal loss in PIN diode 15.

In the alternative circuit shown in FIG. 2 the series-resonant antenna circuit consists of inductance 10 and capacitances 18 and 22. Inductance 16, capacitance 18, and PIN diode 20 form a blocking resonant loop coupled through capacitor 18 to the antenna circuit. The DC disable signal is applied to terminals 24 and 26, which also serve as the RF signal terminals. Note that the polarity of PIN diode 20 must be such that the DC disable signal produces forward current through the diode. When DC current flows through PIN diode 20 inductance 16 is placed in parallel with capacitance 18, creating a parallel resonance which has a minimum response at the resonant frequency, selected to be the Larmor frequency of the sample nuclei. By adjusting inductance 16 it is possible to substantially null the response of the antenna circuit at the resonant frequency. This disables the antenna and minimizes its effect on the other antennae in the MRI system. In this embodiment, the antenna's resonant circuit does not include PIN diode 20 and thus the loss of that diode does not produce unwanted signal loss.

When transmit or receive antennae are placed in close proximity to the patient; they present a potential source of hazardous DC or low frequency AC voltage and current in the event that one or more components fail. The potential for electric shock has become of greater concern with the advent of interventional procedures performed within an MRI system. In such procedures conductive fluids such as normal saline and body fluids from the patient often are present, and it may not be possible to guarantee complete isolation of these fluids from the conducting components associated with the antenna.

For safety and shock prevention, it is possible to electrically isolate the RF signal path by AC coupling the system receiver to the antenna. When blocking techniques such as that shown in FIG. 2 are used, the blocking loop must be kept physically small to avoid inducing RF currents which can turn off or adversely heat the PIN diode 20. PIN diode 20 and inductor 16 must therefore be located at the antenna, so a DC current path must exist from the system electronics to the antenna and complete isolation is not possible.

SUMMARY OF THE INVENTION

The present invention is embodied in an antenna assembly that includes a resonant circuit tuned to a Larmor frequency of the substance being examined by the MRI system. A photosensitive semiconductor switch selectively connects a reactive electrical device to the resonant circuit in response to impingement of light thereby nulling the response of the resonant circuit at the Larmor frequency. A light emitter is coupled, preferably by an optical fiber, to illuminate the photosensitive semiconductor switch.

In the preferred embodiment, the resonant circuit comprises a pair of capacitances connected in series with the inductance of the conducting structure in which the magnetic resonance signals induce an electric current. The reactive electrical device is an inductor that is connected across one of the capacitances by the photosensitive semiconductor switch.

The antenna circuit is altered by changing the conductive state of the photosensitive semiconductor switch. This nulls the response of the resonant antenna circuit at the Larmor frequency, preventing it from adversely affecting operation of other antennae of the MRI system during operating modes when it is not being used. During those modes the operation of the photosensitive semiconductor switch also electrically blocks current induced in the antenna from being conducted into sensitive electronics connected to the antenna. By optically controlling the photosensitive semiconductor switch, a DC electrical path, which could present a potential shock hazard for a patient being examined by the MRI system, is not required.

DETAILED DESCRIPTION OF THE INVENTION

Figure 3:
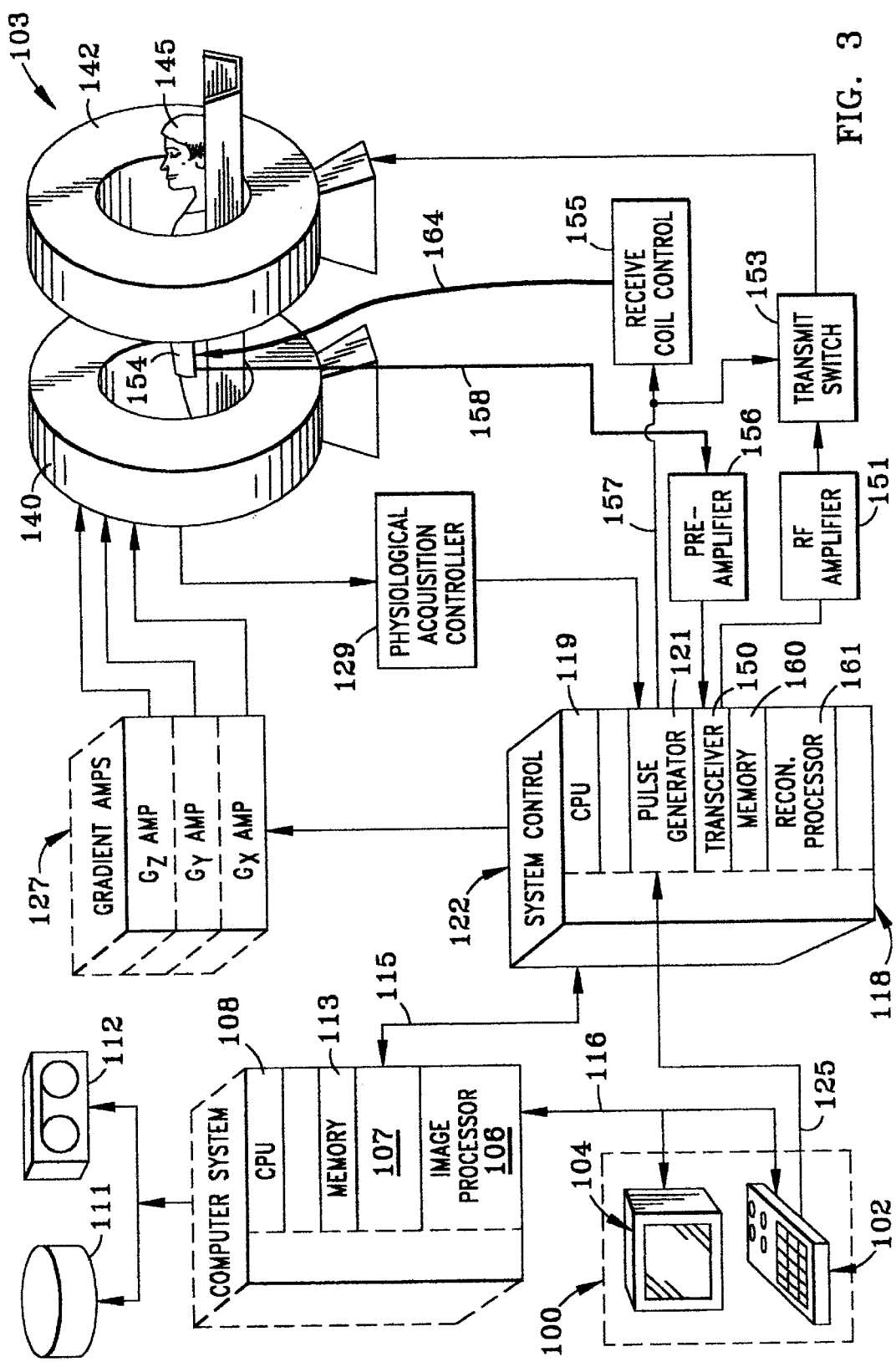
FIG. 3 is a block diagram of an MRI system which employs the present invention.

Referring first to FIG. 3, there is shown the major components of a preferred MRI system, which incorporates the present invention. The operation of the system is controlled from an operator console 100, which includes a keyboard and control panel 102 and a display 104. A separate display (not shown) may be located near the magnet system 103 for viewing by a physician attending the subject of a magnetic resonance imaging (MRI) scan. The console 100 communicates through a link 116 with a computer system 107 that enables an operator to control the production and display of images on the screen 104. The computer system 107 includes a number of modules, which communicate with each other through a backplane. These include an image processor module 106, a CPU module 108 and a memory module 113, known in the art as a frame buffer for storing image data arrays. The computer system 107 is linked to disk storage 111 and a data archive device 112 for storage of image data and programs, and communicates with a separate system control 122 through a high-speed link 115.

The system control 122 includes a set of modules connected together by a backplane. These include a CPU module 119 and a pulse generator module 121, which connects to the operator console 100 through a data link 125. The pulse generator module 121 operates the system components to carry out the desired scan sequence. It produces data indicating the timing, strength and shape of the radio frequency (RF) pulses intended to be produced, and the timing of and length of the data acquisition periods. The pulse generator module 121 also connects to a set of gradient amplifiers 127, to indicate the timing, strength and shape of the gradient pulses to be produced during the scan. The pulse generator module 121 also may receive patient data from a physiological acquisition controller 129 that receives signals from a number of different sensors connected to the patient, such as ECG signals from electrodes or respiratory signals from a bellows.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in the magnet system 103 to produce the magnetic field gradients used for position encoding acquired signals. A transceiver module 150 in the system control 122 produces RF pulses which are amplified by an RF amplifier 151 and coupled to an RF transmit antenna (not shown) in the magnet assembly 103, optionally by a transmit switch 153. The RF transmit antenna may be a fixed assembly integrated into the magnet system 103, a removable assembly with a predetermined position relative to the patient, or a local assembly placed as required against the patient. The RF transmit antenna may be used solely for transmitting RF into the subject or, optionally, may also be used to receive magnetic resonance signals from the subject.

During a receive mode, the resulting magnetic resonance signals radiated by excited nuclei in the patient 145 are sensed by a RF receive antenna assembly 154, which optionally may also be the RF transmit antenna. The RF receive antenna assembly 154 is coupled through cable 158 to a preamplifier 156. The RF receive antenna assembly 154 is enabled by a receive antenna control 155 via an optical fiber 164. The transmit switch 153 and receive antenna control 155 respond to a transmit/receive signal on line 157 from the pulse generator module 121 by electrically connecting the RF amplifier 151 to the RF transmit antenna only during the transmit mode, and by connecting the RF receive antenna assembly 154 to the preamplifier 156 only during the receive mode of operation.

The magnetic resonance signals picked up by the RF receive antenna in assembly 154 are demodulated, filtered and digitized by the receiver section of transceiver module 150 and transferred to a memory module 160 in the system control 122. A reconstruction processor 161 converts the received data into an array of image data. This image data is conveyed through link 115 to the computer system 107 where it is stored in memory module 113 and/or disk memory 111. In response to commands received from the operator console 100, this image data may be archived on the data archive device 112. Optionally, it may be further processed by the image processor 106 and conveyed to the operator console 100 and presented on the display 104.

As noted previously, the resonant circuit in the RF receive antenna assembly 154 can interfere with the proper production of the excitation field during the transmit mode. Therefore, a receive antenna control 155 converts a transmit/receive signal on line 157 into an optical signal by any of a plurality of well-known means. This optical signal is transmitted via optical fiber 164 or other transmission means to receive antenna assembly 154, where it disables an RF receive antenna assembly 154 during transmit mode and enables an RF receive antenna assembly 154 during receive mode.

Figure 4:
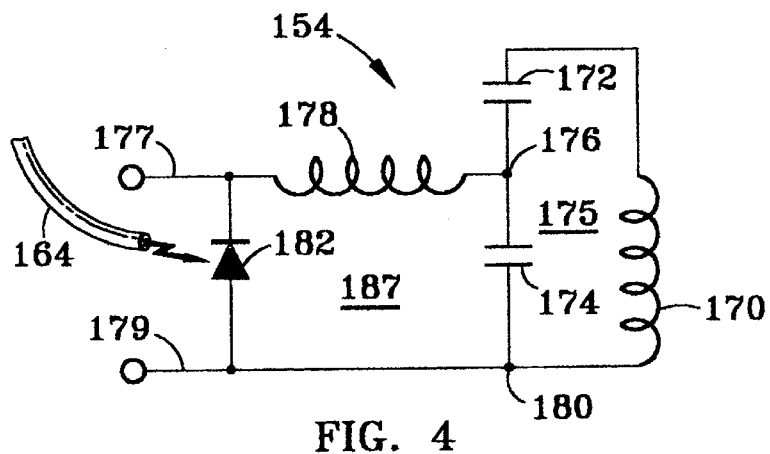
FIG. 4 is a schematic diagram of a first embodiment of a mechanism according to the present invention for disabling the resonant antenna circuit of the antenna assembly in the MRI system of FIG. 3.

Referring to FIG. 4, the antenna assembly 154 comprises an inductance 170 connected to form a resonant circuit 175 with a pair of series connected capacitances 172 and 174 with an intermediate node 176 between the capacitances. The resonant circuit 175 is tuned to the Larmor frequency of the substance being examined, (e.g. human tissue). One conductor of the signal cable 158 is connected via terminal 177 to the intermediate node 176 by an inductor 178 or other reactive electrical device. The other conductor of the signal cable 158 is connected via terminal 179 to a node 180 between the second capacitance 174 and inductance 170. A photosensitive semiconductor device, such as photodiode 182, is connected between the two conductors of the signal cable 158 without regard to diode polarity. Alternatively, the photosensitive device could comprise a PIN-type photodiode, a phototransistor, a photodarlington transistor pair, a light-activated SCR or a photo-FET. The end of the optical fiber 164 is positioned to illuminate the active surface of photodiode 182.

With additional reference to FIG. 3, when the signal on line 157 indicates that the system is in the transmit mode, the receive antenna control 155 responds by producing a light beam which is sent through the optical fiber 164. This light beam illuminates the photodiode 182 in the receive antenna assembly 154, hereby rendering the photodiode conductive. This causes the blocking loop 187 formed by the photodiode 182, input inductor 178, and the second capacitance 174 to be parallel resonant at the Larmor frequency. The blocking loop 187 is coupled to the resonant circuit 175. This blocking loop parallel resonance substantially nulls the response of the resonant circuit 175 at the Larmor frequency, thereby preventing the receive antenna from affecting the performance of the other antennae during the transmit mode. During the receive mode, the receive antenna control 155 does not produce illumination of the photodiode 182 so that the blocking loop 187 does not form a complete parallel resonant circuit and has no effect on the resonant circuit 175. When resonant at the Larmor frequency, blocking loop 187 also presents a high impedance between the preamplifier 156 and resonant circuit 175 which electrically isolates the two components during the transmit mode. Thus any signal induced in the RF receive antenna, due to the intense transmit fields, will be attenuated before reaching the preamplifier and other electronics in the control system 122.

In this embodiment, the electrical current and voltage required to disable resonant circuit 175 are remote from the RF antenna assembly 154, being isolated by the optical fiber 164. The DC path required for the prior antenna disabling techniques has been eliminated. As a result, potentially hazardous electrical voltages and currents arising from any source in the system, which might be transmitted to the subject by an electrically conducting signal path intended for disabling the RF receive antenna, are isolated from the RF antenna assembly 154 by the optical fiber. As a consequence, the patient being examined is not subjected to an electrical shock potential in the event of a failure of components connected to the receive antenna, provided that the RF path is also isolated by any of a plurality of well-known means, and that no additional electrically conducting paths are introduced.

Figure 5:
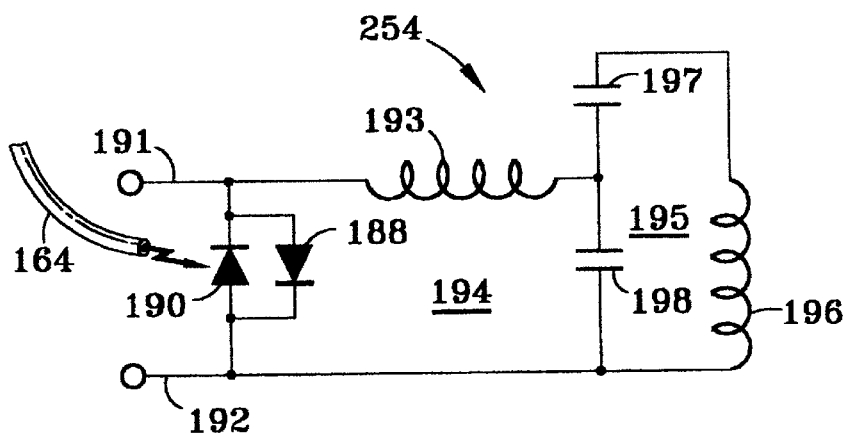
FIG. 5 depicts a second embodiment of a mechanism according to the present invention for disabling the resonant antenna circuit.

FIG. 5 illustrates an alternative embodiment 254 of the present optical technique for disabling an RF antenna. This embodiment is similar to that of FIG. 4 but has been modified with the addition of a semiconductor switch 188 in parallel with the photosensitive device 190, but with the opposite polarity (i.e. an anti-parallel connection with photosensitive device 190). In such a configuration, the normal forward current between terminals 191 and 192 through semiconductor switch 188 is opposite that of normal forward current between terminals 191 and 192 through photodiode 190. Semiconductor switch 188 may, for example, be a PIN type diode, transistor, FET or SCR. The current produced by the photodiode or other type of photosensitive device 190, when illuminated, will flow through and partially turn on semiconductor switch 188 thereby reducing the net RF impedance between terminals 191 and 192. This will reduce the on-state impedance in blocking loop 194, increasing the degree to which the parallel resonance of blocking loop 194 nulls the response of resonant circuit 195 comprising inductance 196 and two capacitances 197 and 198.

As a variation of the second embodiment, the semiconductor switch 188 may also be a photodiode or other type of photosensitive device. In this case, best operation will be obtained if provision is made to adequately illuminate both photosensitive devices 190 and 188 in order to render those devices conductive.

Figure 1:
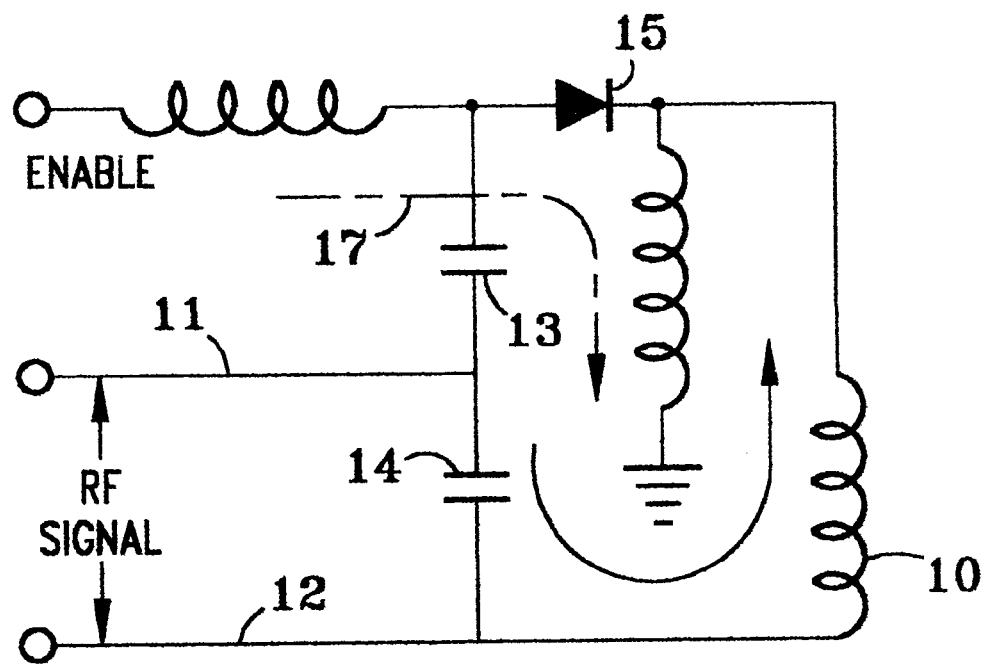
FIG. 1 is a schematic diagram of an antenna assembly circuit for an MRI system which circuit includes a prior mechanism for disabling the antenna.
Figure 2:
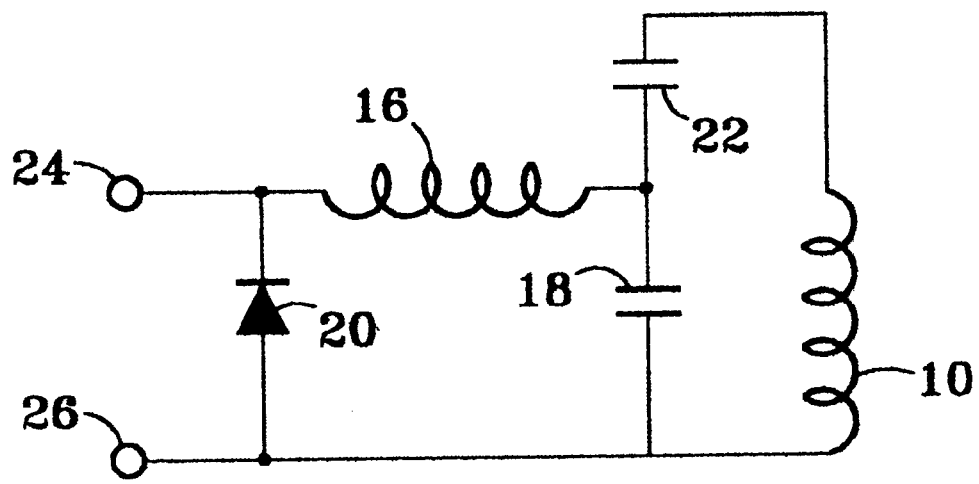
FIG. 2 is a schematic diagram of another antenna assembly circuit with a different prior mechanism for disabling the antenna.
Figure 6:
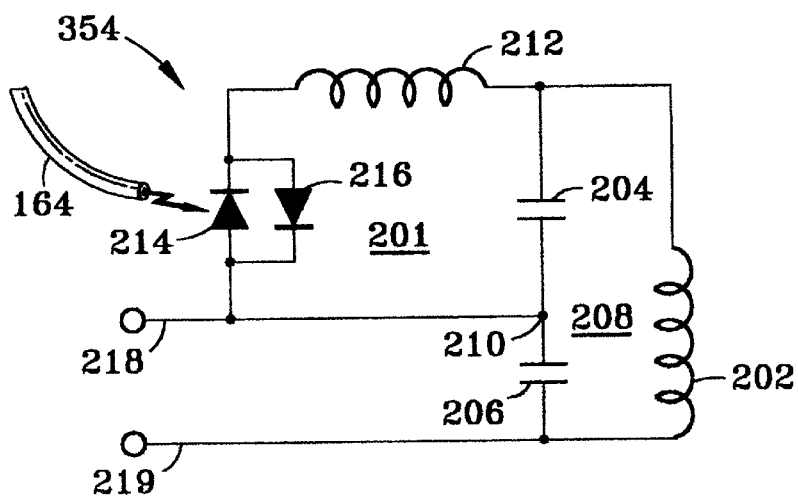
FIG. 6 depicts a third embodiment of a mechanism according to the present invention for disabling the resonant antenna circuit.

FIG. 6 illustrates an alternative third embodiment 354 of the present optical technique for disabling an RF antenna. This embodiment has a parallel resonant blocking loop 201, comprised of photosensitive semiconductor switch 214, inductor 212, and capacitance 204 rather than capacitance 206 corresponding to capacitances 174 and 198 in FIGS. 4 and 5, respectively, and optionally semiconductor switch 216. This can be done because there is no need to provide an electrically conducting path to photosensitive semiconductor device 214 as is the case for PIN diode 20 in FIG. 2. Device 214 may be connected without regard to diode polarity, and may be a photodiode, a PIN-type photodiode, a phototransistor, a photodarlington transistor pair, a light-activated SCR or a photo-FET. If semiconductor switch 216 is omitted the circuit operation is identical to that of the first embodiment in FIG. 4, while offering an additional option for physical placement of the components of blocking loop 201. The circuit of FIG. 6 offers the further advantage that photosensitive semiconductor switch 214 and inductance 212 are not in the signal path between the resonant circuit 208 and the signal cable 158 connected to terminals 218 and 219, and therefore do not attenuate the received signal in receive mode.

As a variation of the third embodiment, the modifications of the second embodiment shown in FIG. 5, that is, the addition of a semiconductor switch 216 anti-parallel with the photosensitive semiconductor device 214, may be applied to the circuit of FIG. 6. This will reduce the on state impedance in blocking loop 201, increasing the degree to which the parallel resonance of blocking loop nulls the response of resonant circuit 208. As a further variation of the third embodiment, the anti-parallel semiconductor switch 216 may also be a photodiode or other type of photosensitive device or any semiconductor activated by photodiode 214.

The foregoing description was primarily directed to a preferred embodiment of the invention. Although some attention was given to various alternatives within the scope of the invention, it is anticipated that one skilled in the art will likely realize additional alternatives that are now apparent from disclosure of embodiments of the invention. For example, the invention may be used to disable a transmit antenna rather than a receive antenna, and may be used in systems other than MRI systems where similar functionality is desirable. Accordingly, the scope of the invention should be determined from the following claims and not limited by the above disclosure.

We claim:

1. An antenna assembly for a magnetic resonance imaging system that produces images of a substance, said antenna assembly comprising:

a resonant circuit having a first inductance and being tuned to resonate at a Larmor frequency of the substance;

a reactive electrical device;

a photosensitive first semiconductor switch selectively connecting the reactive electrical device to the resonant circuit, wherein impingement of light on the photosensitive first semiconductor switch alters connection of the reactive electrical device to the resonant circuit thereby substantially nulling the response of resonant circuit at the Larmor frequency; and a receive coil control coupled to illuminate the photosensitive first semiconductor switch.

2. The antenna assembly, as recited in claim 1, wherein the reactive electrical device is a second inductance.

3. The antenna assembly, as recited in claim 1, wherein the photosensitive first semiconductor switch is selected from a group consisting of a photodiode, a PIN-type photodiode, a phototransistor, a photo-FET, a photodarlington pair of transistors, and a light-activated SCR.

4. The antenna assembly, as recited in claim 1, further comprising a second semiconductor switch connected in parallel with the photosensitive first semiconductor switch.

5. The antenna assembly, as recited in claim 4, wherein the second semiconductor switch is selected from a group consisting of a diode, a PIN-type diode, a transistor, a FET and a SCR.

6. The antenna assembly, as recited in claim 5, wherein the second semiconductor switch is connected in parallel with the photosensitive first semiconductor switch with a polarity as to conduct current in a direction opposite that of current in the photosensitive first semiconductor switch.

7. The antenna assembly, as recited in claim 6, wherein the second semiconductor switch is selected from a group consisting of a photodiode, a PIN-type photodiode, a phototransistor, a photodarlington pair of transistors, a photo-FET, and a light-activated SCR, and is illuminated while the first semiconductor switch is being illuminated.

8. The antenna assembly, as recited in claim 1, wherein the resonant circuit comprises a pair of capacitances connected in series with the first inductance.

9. The antenna assembly, as recited in claim 8, wherein the photosensitive first semiconductor switch selectively connects the reactive electrical device across one of the pair of capacitances.

10. The antenna assembly, as recited in claim 1, further comprising an optical fiber coupling the receive coil control to the photosensitive first semiconductor switch.

11. An antenna assembly for receiving a magnetic resonance signals from substance, said antenna assembly comprising:

a radio frequency receive antenna in which the magnetic resonance signals induce an electric current, the radio frequency receive antenna having first and second terminals;

first and second capacitors connected in series with the radio frequency receive antenna to form a resonant circuit which resonates at a Larmor frequency of the substance;

a node between the first and second capacitors;

a reactive electrical device having a first terminal connected to the node and having a second terminal;

a photosensitive first semiconductor switch connected between the second terminal of the reactive electrical device and the first terminal of the radio frequency receive antenna; and a receive coil control operatively coupled to illuminate the photosensitive first semiconductor switch and render the photosensitive first semiconductor switch in a conductive state causing response of the resonant circuit at the Larmor frequency to be substantially nulled.

12. The antenna assembly, as recited in claim 11, wherein the photosensitive first semiconductor switch is selected from a group consisting of a photodiode, a phototransistor, a photo-FET, a photodarlington pair of transistors, and a light-activated SCR.

13. The antenna assembly, as recited in claim 11, further comprising a second semiconductor switch connected in parallel with the photosensitive first semiconductor switch.

14. The antenna assembly, as recited in claim 13, where the second semiconductor switch is a diode connected with polarity opposite that of the photosensitive first semiconductor switch.

15. The antenna assembly, as recited in claim 14, wherein the diode is a photodiode.

16. The antenna assembly, as recited in claim 11, wherein the reactive electrical device is an inductor.

17. The antenna assembly as recited in claim 11 further comprising an optical fiber coupling the receive coil control to the photosensitive first semiconductor switch.

18. The antenna assembly as recited in claim 11 wherein the photosensitive first semiconductor switch and the reactive electrical device are connected in series with each other and together are connected between the node between the first and second capacitors and the second terminal the radio frequency receive antenna.

19. The antenna assembly as recited in claim 18, further comprising a second semiconductor switch connected in parallel with photosensitive first semiconductor switch, and with polarity opposite that of photosensitive first semiconductor switch.

20. The antenna assembly as recited in claim 19, wherein second semiconductor switch is a diode.

21. A controlled antenna assembly for a magnetic resonance imaging system that produces images of a substance and prevents electrical shock hazards, said antenna assembly comprising:

a resonant circuit having a first inductance and being tuned to resonate at a Larmor frequency of the substance;

a reactive electrical device;

a photosensitive first semiconductor switch selectively connecting the reactive electrical device to the resonant circuit, wherein impingement of light on the photosensitive first semiconductor switch alters connection of the reactive electrical device to the resonant circuit thereby substantially nulling response of said resonant circuit at the Larmor frequency; and a receive coil control coupled to illuminate the photosensitive first semiconductor switch and said receive coil control being coupled to form a signal path to isolate hazardous electrical voltages and currents from said substance.

22. The controlled antenna assembly, as recited in claim 21, further comprising an optical fiber coupling the receive coil control to the photosensitive first semiconductor switch.

* * * * *